United States Patent
Hsieh

(10) Patent No.: US 8,004,009 B2
(45) Date of Patent: Aug. 23, 2011

(54) TRENCH MOSFETS WITH ESD ZENER DIODE

(75) Inventor: Fu-Yuan Hsieh, Kaohsiung (TW)

(73) Assignee: Force Mos Technology Co., Ltd. (TW)

( * ) Notice: Subject to any disclaimer, the term of this patent is extended or adjusted under 35 U.S.C. 154(b) by 157 days.

(21) Appl. No.: 12/453,631

(22) Filed: May 18, 2009

(65) Prior Publication Data

US 2010/0289073 A1  Nov. 18, 2010

(51) Int. Cl.
*H01L 29/66* (2006.01)

(52) U.S. Cl. ........ 257/173; 257/328; 257/333; 257/551; 257/E29.262; 257/E29.335; 438/140

(58) Field of Classification Search .................. 257/173, 257/328, 333, 551, E29.262, E29.335; 438/140
See application file for complete search history.

(56) References Cited

U.S. PATENT DOCUMENTS

| 2007/0176239 A1* | 8/2007 | Hshieh ......................... 257/355 |
| 2009/0140333 A1* | 6/2009 | Pan et al. ..................... 257/334 |

* cited by examiner

*Primary Examiner* — Tu-Tu V Ho
(74) *Attorney, Agent, or Firm* — Bacon & Thomas, PLLC

(57) ABSTRACT

A semiconductor power device with Zener diode for providing an electrostatic discharge (ESD) protection and a thick insulation layer to insulate the Zener diode from a doped body region. The semiconductor power device further includes a Nitride layer underneath the thick oxide layer working as a stopper layer for protecting the thin oxide layer and the body region underneath whereby the over-etch damage and punch-through issues in process steps are eliminated.

8 Claims, 10 Drawing Sheets

TRENCH MOSFETS WITH ESD ZENER DIODE

FIELD OF THE INVENTION

This invention relates generally to the cell structure and device configuration of semiconductor devices. More particularly, this invention relates to an improved electrostatic discharge (ESD) protection having no Si damage and no punch-through issues during the process steps.

BACKGROUND OF THE INVENTION

In U.S. Pat. No. 6,413,822, for the purpose of providing over-voltage ESD protection, a Zener diode is formed at the peripheral area or gate pad area of the MOSFET device. The Zener diode is supported on a thick oxide layer and includes an array of doped regions arranged as n+pn+pn+ regions. However, the prior art still has technical difficulties in dealing with the ESD problems in manufacturing. Specifically, damage of the gate oxide layer and the Si area of the body region can easily be induced during the dry oxide etch to etch the thick oxide layer prior to source ion implantation because there is no a stopper layer to protect the body region and the channel region during the dry oxide etch process, therefore the device may suffer over-etch in gate oxide and channel region, as shown in FIG. 1. On the other hand, it also may cause Si damage when there is no screen oxide for the subsequent source ion implantation in the process. Even if the screen oxide for source ion implantation is grown, Boron near channel region will leach out during screen oxidation, which will cause punch-through issue.

Therefore, there is still a need in the art of the semiconductor device fabrication, particularly for trenched power semiconductor design and fabrication, to provide a novel cell structure, device configuration and fabrication process that would resolve these difficulties and design limitations. Specifically, it is desirable to provide effective method to reduce a likelihood of device damages caused in fabrication process. In the meantime, it is also desirable to eliminate the problem caused by punch-through issue.

SUMMARY OF THE INVENTION

It is therefore an object of the present invention to provide a new and improved semiconductor power device configuration and manufacture process to solve the problems discussed above for better ESD protection.

One aspect of the present invention is that, a Nitride layer is formed onto the thin oxide layer before the deposition of the thick oxide layer. The extra Nitride layer acts as a stopper layer while etching the thick oxide layer, resulting no over-etching issue and protecting the thin oxide layer underneath, therefore preventing Si damage from happening, as shown in FIG. 2A. At the same time, during source ion implantation, the thin oxide layer will act as the screen oxide layer for the source ion implantation because it isn't etched off when etching the thick oxide layer and nitride layer, therefore resolving the problems of Si damage and the accordingly Boron leaching out, as shown in FIG. 3D.

Briefly, in a preferred embodiment, as shown in FIG. 2A, the present invention discloses a semiconductor power device cell MOSFET cell comprising: an epitaxial layer lightly doped with a first semiconductor doping type, e.g., N dopant, grown on a substrate heavily doped with the first semiconductor doping type; a plurality of trenched gates and at least a wider trenched gate for gate connection formed within said epitaxial layer and filled with doped poly over a gate oxide; body regions doped with a second semiconductor doping type, e.g., P dopant, extending between every two said adjacent trenched gates with N+ source regions near its top surface in active area; an Nitride layer formed onto a thin oxide layer; a thick oxide layer formed onto said Nitride layer; a Zener diode formed onto said thick oxide layer and composed of alternative n+pn+pn+ doping areas; a plurality of contact trenches penetrating a thick oxide interlayer and extending into said source regions, said body regions, two electrodes of said Zener diode and said wider trenched gate, respectively; Tungsten plugs filled into all said contact trenches over a barrier layer of Ti/TiN or Co/TiN; source metal connected with said source regions, said body regions and one electrode of said Zener diode via trenched source-body contact and one trenched Zener diode electrode contact; gate metal connected with said wider trenched gate and another electrode of said Zener diode via trenched gate contact and another trenched Zener diode electrode contact; a p+ area underneath the bottom of each said trenched source-body contact to further reduce contact resistance.

These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE EMBODIMENTS

Figure 1:
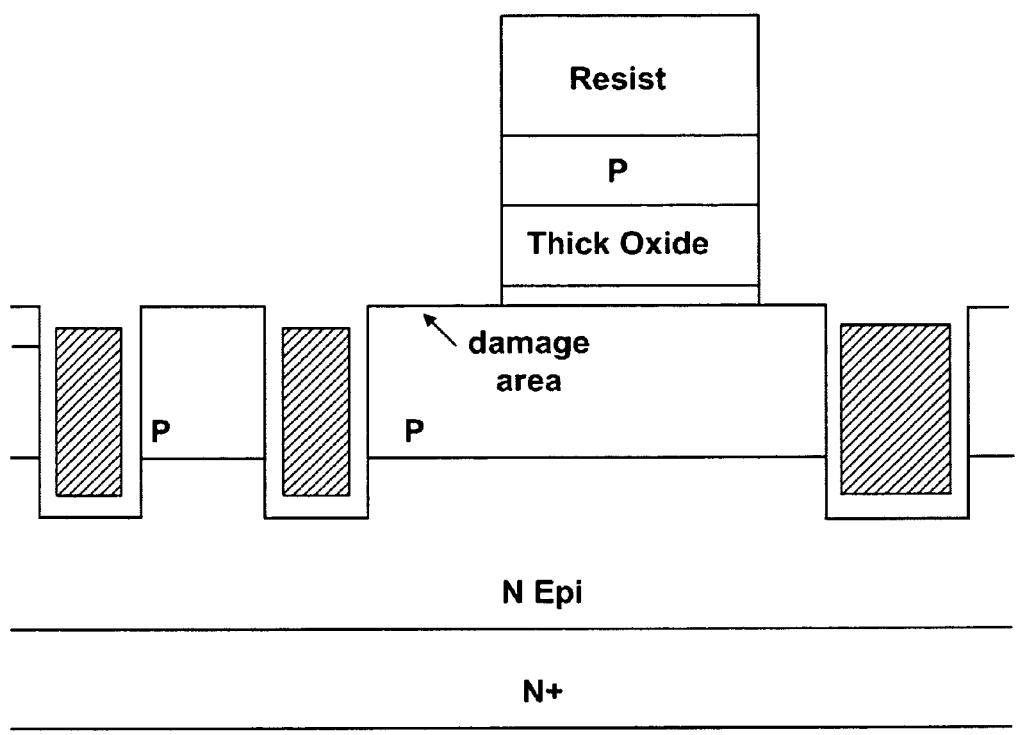
FIG. 1 is a side cross-sectional view of a prior art to illustrate the damage area caused by the dry oxide etch due to the lack of stopper layer.
Figure 2A:
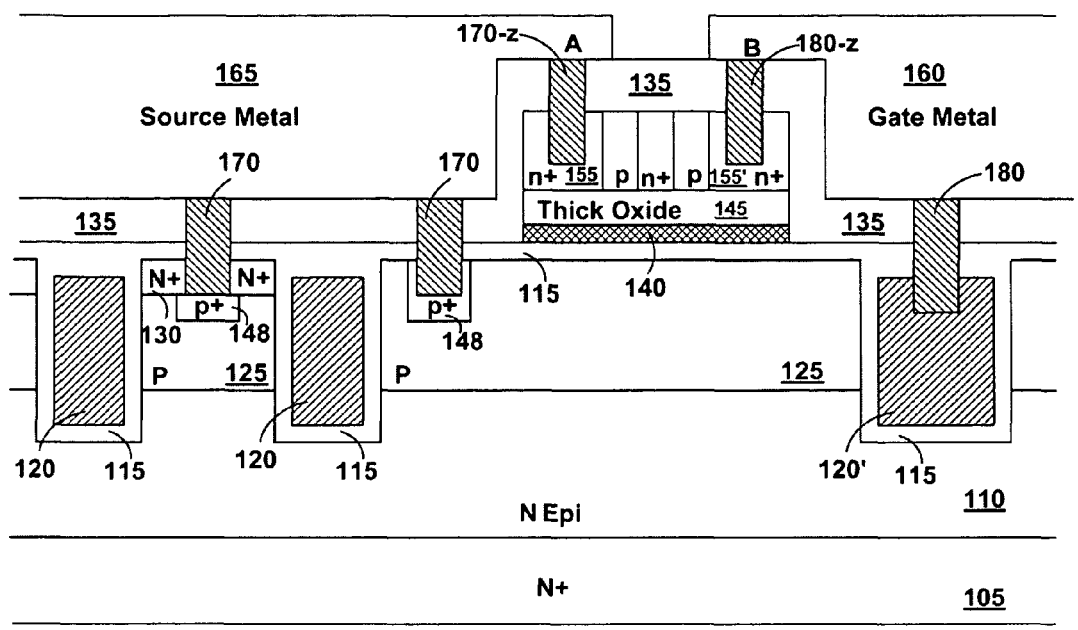
FIG. 2A is a side cross-sectional view of a MOSFET with a Nitride layer of this invention.
Figure 2B:
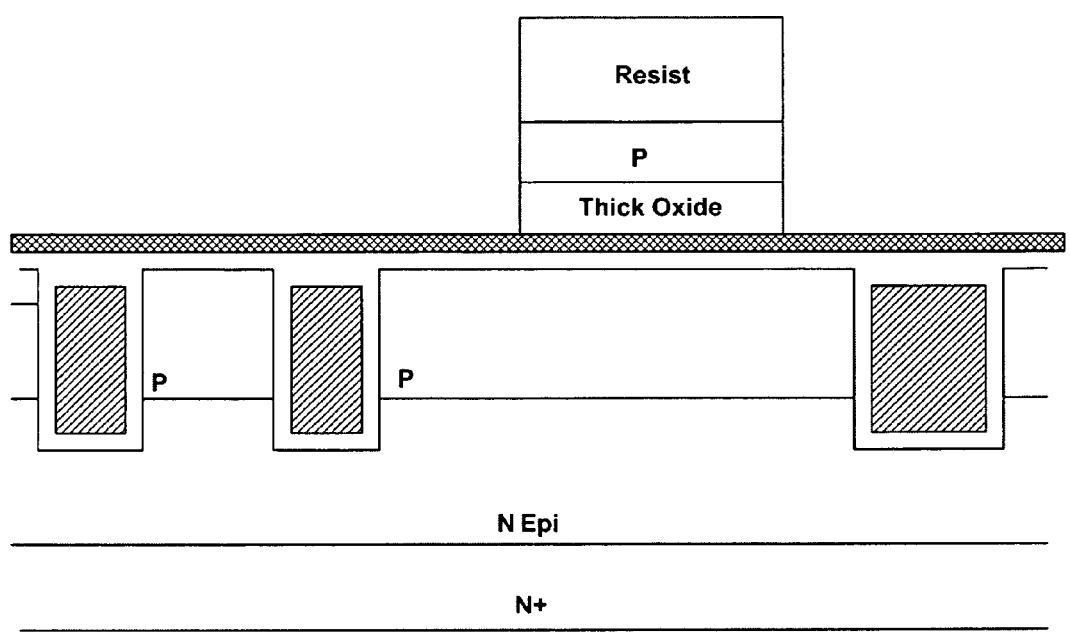
FIG. 2B is a side cross-sectional view for showing how the Nitride works as a stopper to protect the thin oxide underneath.

Please refer to FIG. 2A for a preferred embodiment with an Nitride layer according to the present invention. The semiconductor power device cell is formed on an N+ substrate 105 onto which grown an N epitaxial layer 110 with lower concentration than said N+ substrate 105. A plurality of gate trenches and at least a wider gate trench for gate connection are etched into the epitaxial layer 110. Doped poly is filled within those gate trenches over a gate oxide layer 115 to serve as a plurality of trenched gates 120 and at least a wider trenched gate 120' for gate connection. P-body regions 125 are extending between every two of trenched gates 120 and 120' with N+ source regions 130 formed near its top surface within active area. Onto the thin oxide layer 115 along the top surface of epitaxial layer, the inventive Nitride layer 140 and a thick oxide layer 145 is formed successively, and a Zener diode composed of alternative n+pn+pn+ doped regions is formed onto said thick oxide layer 145. Through a thick oxide interlayer 135 covering said thin oxide layer 115, the top surface of said Zener diode, the sidewalls of said Zener diode and said thick oxide layer 145 and said Nitride layer 140, contact trenches are etched into said source regions 130, said body regions 125, one electrode 155 of said Zener diode, another electrode 155' of said Zener diode, and said wider trenched gate 120', respectively. Those contact trenches are filled with Tungsten plugs over a barrier layer of Ti/TiN or Co/TiN to act as trenched source-body contacts 170, trenched Zener diode electrode contacts 170-z and 180-z, and trenched gate contact 180, respectively. Via those trenched contacts, said source regions 130 and said body regions 125 and one electrode 155 of said Zener diode are connected with source metal 165; said wider trenched gate 120' and another electrode 155' of said Zener diode are connected with gate metal 160. Especially, underneath each bottom of said trenched source-body contacts 170, there is a p+ area 148 to further reduce the contact resistance.

Figure 3A:
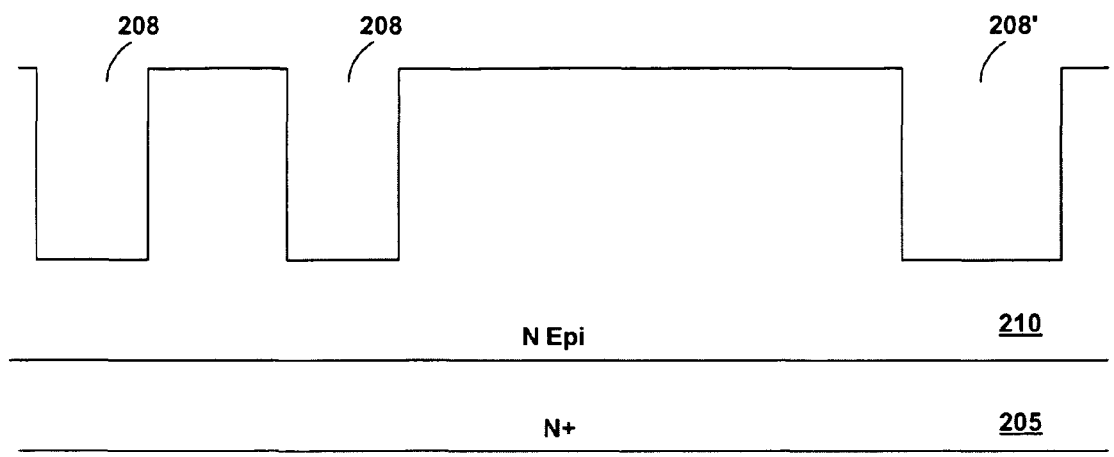
FIG. 3A to 3G are a serial of side cross-sectional views for showing the process steps for fabricating a MOSFET device as shown in FIG. 2A.
Figure 3B:
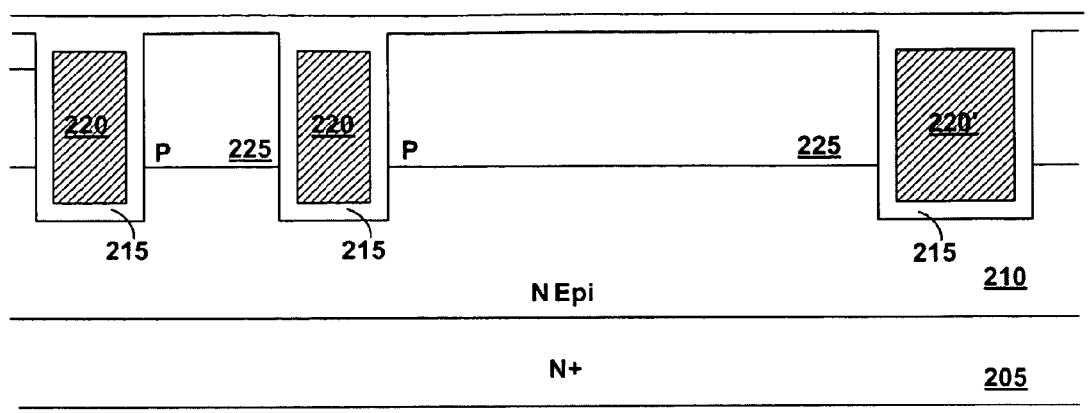

Please refer to FIG. 3A to 3G for a serial of side cross-sectional views to illustrate the fabrication steps of the semiconductor power device cell shown in FIG. 2A. In FIG. 3A, a trench mask (not shown) is applied to open a plurality of gate trenches 208 an at least a wider gate trench 208' for gate connection in an N epitaxial layer 210 supported on a N+ substrate 205 by employing a dry silicon etch process. In FIG. 3B, all those gate trenches are oxidized with a sacrificial oxide to remove the plasma damage during the process of opening those trenches. Then gate oxide layer 215 is grown followed by depositing doped poly to fill those gate trenches. The filling-in doped poly is then etched back or CMP (Chemical Mechanical Polishing) to form trenched gates 220 and at least a wider trenched gate 220' for gate connection. Next, the manufacturing process proceeds with a P-body implantation with a P-type dopant ion implantation and an elevated temperature is applied to diffuse the P-body 225 into the epitaxial layer 210.

Figure 3C:
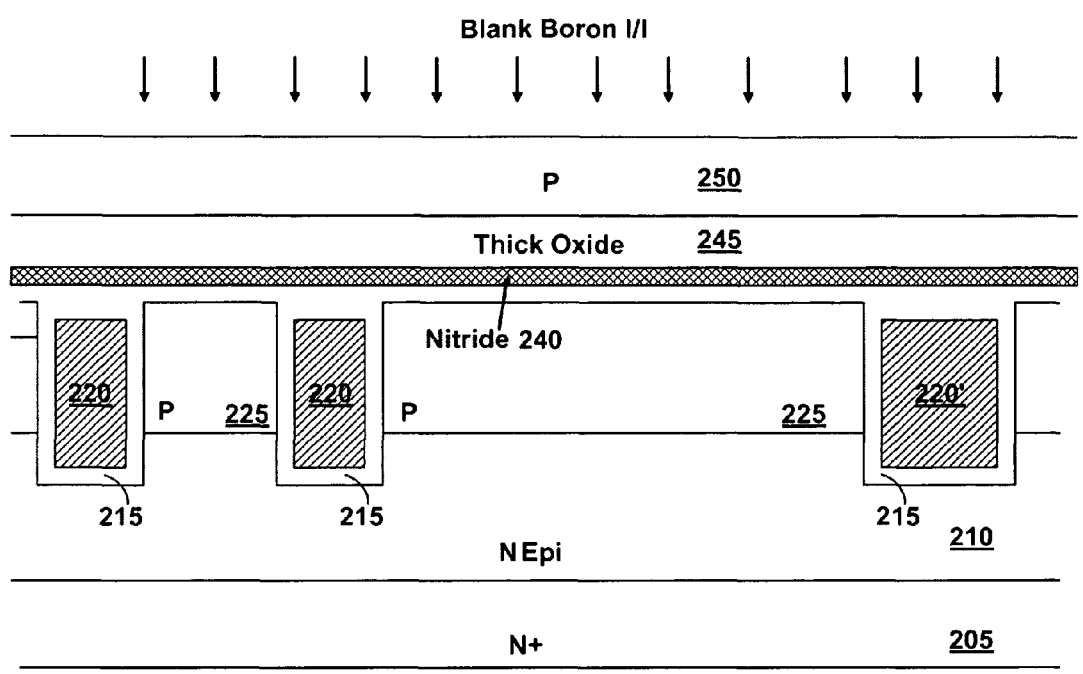
Figure 3D:
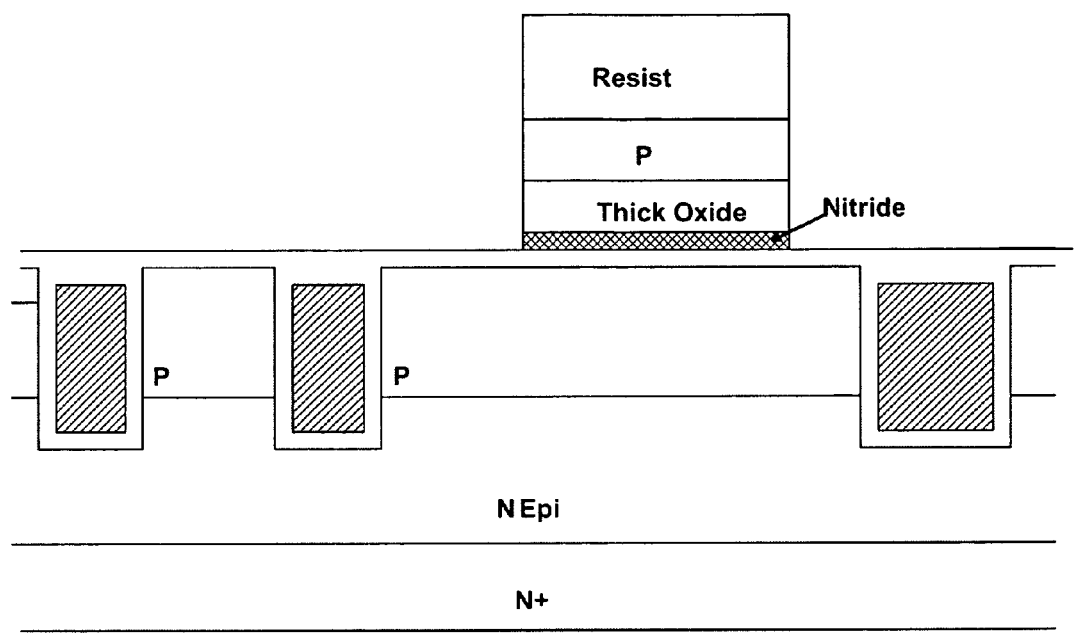

In FIG. 3C, the process continues in turn with the deposition of a Nitride layer 240 and a thick oxide layer 245. The thickness of the thick oxide layer is greater than 1000 angstroms. Then, a poly silicon layer 250 is then deposited on top of said thick oxide layer 245 followed by a p-type dopant ion implantation with a blank Boron ion. In FIG. 3D, a photo resist is applied as a poly-silicon mask to etch the P type poly silicon, said thick oxide layer and said Nitride layer by successively oxide etch, dry oxide etch and Nitride etch process.

Figure 3E:
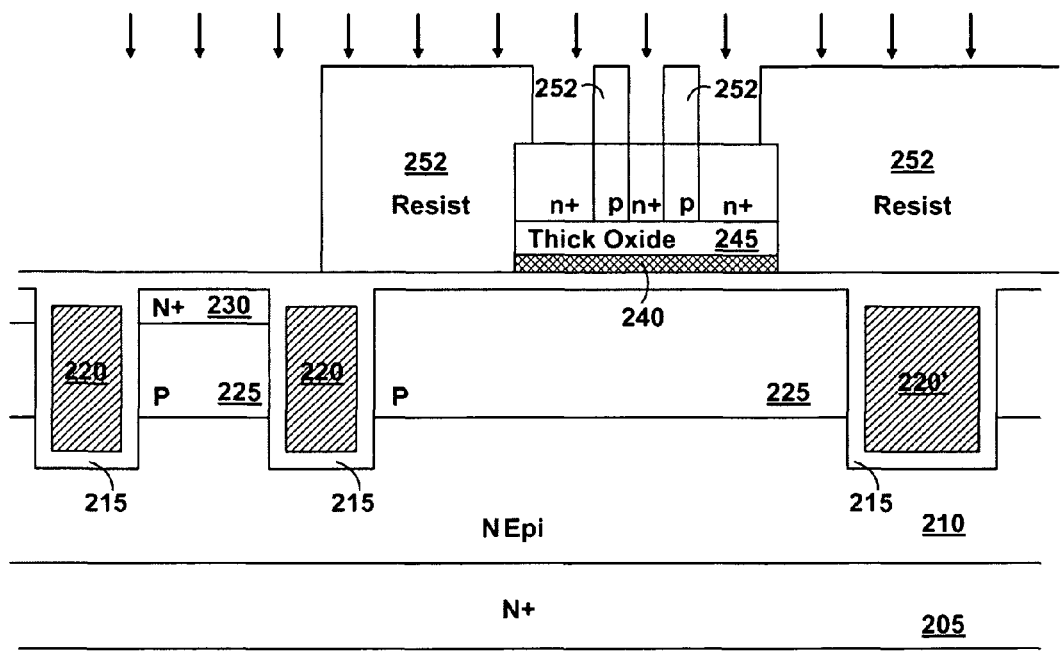
Figure 3F:
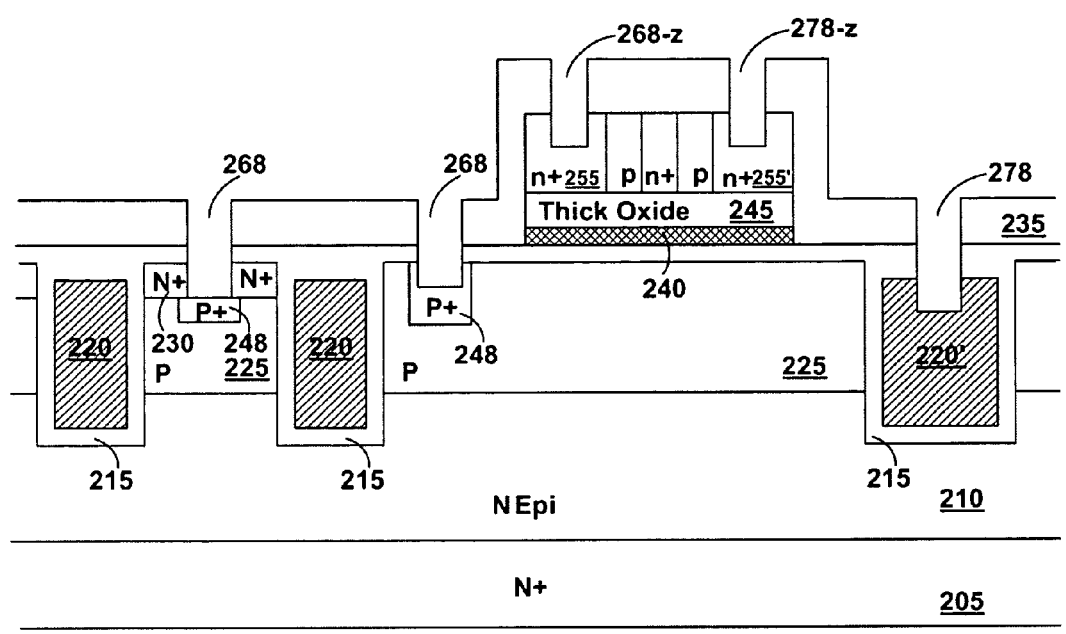
Figure 3G:
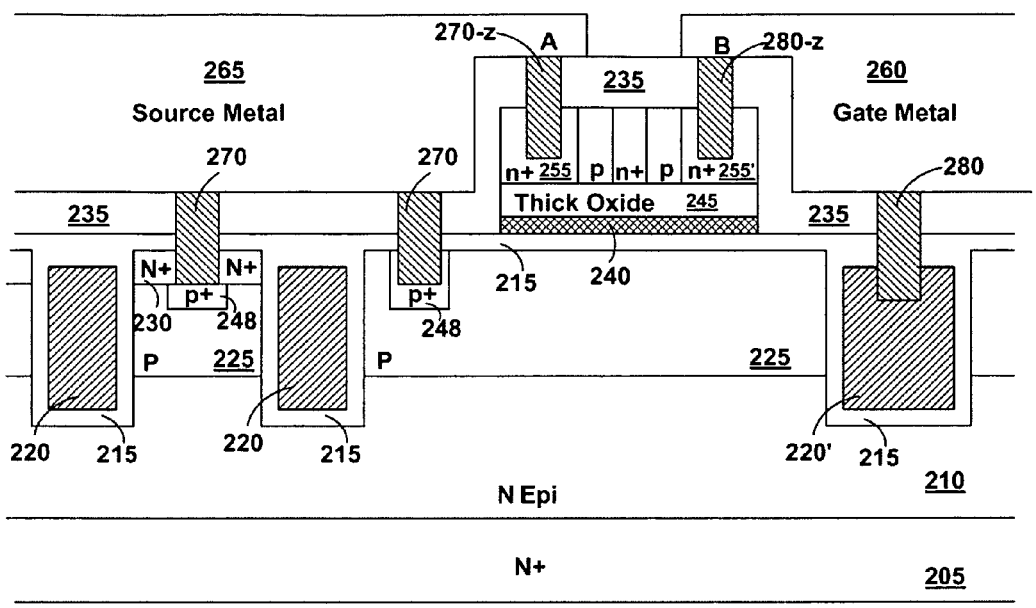

In FIG. 3E, after the removal of photo resist in FIG. 3D, another photo resist 252 is employed as the source mask. Then, above the top surface of whole device, an Arsenic or Phosphorus ion implantation is carried out to form source regions 230 and the n+ portion of Zener diode. In FIG. 3F, a thick oxide interlayer 235 is deposited covering said thin oxide layer 215, the top surface of said Zener diode, the sidewalls of said Zener diode and said thick oxide 245 and said Nitride layer 240. Then, onto said thick oxide interlayer 235, a contact mask (not shown) is applied to open a plurality of contact trenches. Within these contact trenches, trenches 268 are etched into said source regions 230 and said body regions 225, trench 268-z is etched into one electrode 255 of said Zener diode, trench 278-z is etched into another electrode 255' of said Zener diode and trench 278 is etched into said wider trenched gate. Then, a Boron ion implantation is carried out to form p+ area underneath each bottom of contact trench 268. In FIG. 3G, tungsten plugs are filled into all contact trenches after the deposition of a barrier layer composed of Ti/TiN or Co/TiN along the inner surface of contact trenches and then etched back or CMP to form trenched source-body contacts 270, trenched Zener diode electrode contact 270-z and 280-z, and trenched gate contact 280. Next, a front metal layer is deposited and then patterned by metal mask (not shown) to form source metal 265 and gate metal 260 by metal etch. The source metal 265 is connected with said source regions 230, said body regions 225 and one electrode 255 of said Zener diode via said trenched source-body contacts 270 and one trenched Zener diode electrode contact 270-z, respectively. The gate metal 260 is connected with said wider trenched gate 220' and another electrode 255' of said Zener diode via said trenched gate contact 280 and another trenched Zener diode electrode contact 280-z, respectively.

According to the above drawings and descriptions, this invention further discloses a method for solving the problems of over etch damage and punch-through issues. The method includes a step of depositing a Nitride layer underneath the thick oxide layer.

Although the present invention has been described in terms of the presently preferred embodiments, it is to be understood that such disclosure is not to be interpreted as limiting. Various alternations and modifications will no doubt become apparent to those skilled in the art after reading the above disclosure. Accordingly, it is intended that the appended claims be interpreted as covering all alternations and modifications as fall within the true spirit and scope of the invention.

What is claimed is:

1. A semiconductor power device comprising a Zener diode connected between a gate metal and a source metal for providing an electrostatic discharge (ESD) protection, said semiconductor power device further comprising:
    an insulation oxide layer comprising a separately formed thick oxide layer on top of a Nitride layer and thin oxide layer, with a thickness greater than gate oxide for completely insulating said Zener diode from a body region, said Nitride layer sandwiched between said thick oxide layer and said thin oxide layer functioning as dry oxide etching stopper for preventing Si damage from happening; and
    said nitride layer having a thickness ranging from 500~2000 angstroms.

2. The semiconductor power device of claim 1, wherein said thick oxide layer is CVD oxide.

3. The semiconductor power device of claim 1, wherein said thick oxide layer has a thickness substantially greater than 1000 angstroms.

4. The semiconductor power device of claim 1, wherein said Zener diode further comprising multiple doped polysilicon regions includes an array of doped regions arranged as n+pn+pn+ or n+pn+pn+pn+ or n+pn+pn+pn+pn+ for N-channel device and p+np+np+ or p+np+np+np+ or p+np+np+np+np+ for P-channel device.

5. The semiconductor power device of claim 1 further comprising:
    an overlying insulation layer covering said semiconductor power device and said Zener diode wherein said overlying insulation layer having a plurality of trenched contact plugs disposed in contact trenches penetrating through said insulation layer wherein some of said trenched contact plugs are in electrical contact with a source region and said body region and said source metal and one electrode of said Zener diode, and other of said trenched contact plugs are in electrical contact with a gate and said gate metal and also with another electrode of said Zener diode.

6. The semiconductor power device of claim 5, wherein said trenched contact plugs further comprising tungsten contact plugs.

7. The semiconductor power device of claim 5, wherein said trenched contact plugs further comprising tungsten contact plugs surrounded by a Ti/TiN or Co/TiN barrier layer.

8. The semiconductor power device of claim 1, wherein said semiconductor power device further comprising a metal oxide semiconductor field effect transistor (MOSFET) device.

* * * * *